United States Patent [19]

Braun

[11] Patent Number: 4,563,688

[45] Date of Patent: Jan. 7, 1986

[54] FLUID JET PRINTER AND METHOD OF ULTRASONIC CLEANING

[75] Inventor: Hilarion Braun, Xenia, Ohio

[73] Assignee: Eastman Kodak Company, Rochester, N.Y.

[21] Appl. No.: 495,183

[22] Filed: May 16, 1983

[51] Int. Cl.[4] ...................... G01D 15/18; H01L 41/04

[52] U.S. Cl. ........................................ 346/1.1; 346/75; 346/140 R; 310/323; 310/325

[58] Field of Search ...................... 346/75, 140 R, 1.1; 310/323, 325, 15

[56] References Cited

U.S. PATENT DOCUMENTS

| | | | |
|---|---|---|---|
| 2,514,080 | 7/1950 | Mason | 310/15 |
| 3,131,515 | 5/1964 | Mason | 310/323 X |
| 3,661,304 | 5/1972 | Martinez et al. | 222/394 |
| 3,701,998 | 10/1972 | Mathis | 346/75 |
| 4,007,465 | 2/1977 | Chaudhary | 346/140 |
| 4,123,761 | 10/1978 | Kimura et al. | 346/140 |
| 4,144,537 | 3/1979 | Kimura et al. | 346/140 |
| 4,223,322 | 9/1980 | Raamsdonk | 346/140 |
| 4,228,440 | 10/1980 | Horike | 346/75 |
| 4,240,081 | 12/1980 | Devitt | 346/75 |
| 4,245,224 | 1/1981 | Isayama et al. | 346/75 |
| 4,257,052 | 3/1981 | Stoneburner | 346/75 |
| 4,276,554 | 6/1981 | Terasawa | 346/140 |
| 4,293,867 | 10/1981 | Isayama | 346/140 |
| 4,296,418 | 10/1981 | Yamazaki et al. | 346/75 |
| 4,306,245 | 12/1981 | Kasugayama et al. | 346/140 |
| 4,323,908 | 4/1982 | Lee et al. | 346/140 |
| 4,326,553 | 4/1982 | Hall | 134/153 |
| 4,340,897 | 7/1982 | Miller | 346/140 |
| 4,466,005 | 8/1984 | Yoshimura | 346/140 R |

OTHER PUBLICATIONS

Ultrasonics, 2d Ed., 1960, pp. 116–120, B. Carlin.

*Primary Examiner*—Joseph W. Hartary
*Assistant Examiner*—Gerald E. Preston
*Attorney, Agent, or Firm*—Biebel, French & Nauman

[57] ABSTRACT

A fluid jet system for producing at least one jet drop stream includes a print head having a fluid receiving reservoir and an orifice plate provided with orifices communicating with the reservoir in such a manner that fluid supplied to the reservoir under pressure emerges from the orifices as fluid filaments. A transducer responsive to a drive signal applies vibrational energy to the orifice plate for stimulating breakup of the fluid fliaments into streams of drops of substantially uniform size and spacing. A drive circuit applies a substantially sinusoidal drive signal to the transducer for stimulating such breakup. Cleaning of the print head is accomplished by applying to the transducer a pulse train including harmonics of the sinusoidal stimulation drive signal.

17 Claims, 6 Drawing Figures

FIG-1
FIG-2
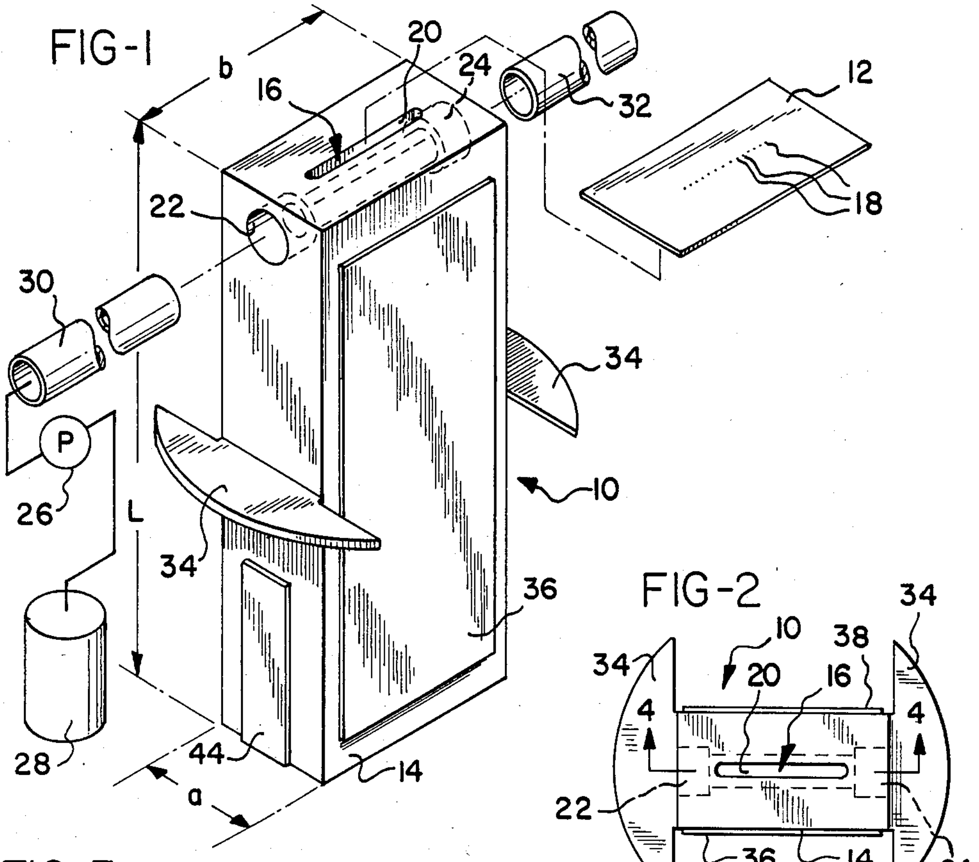
FIG-3
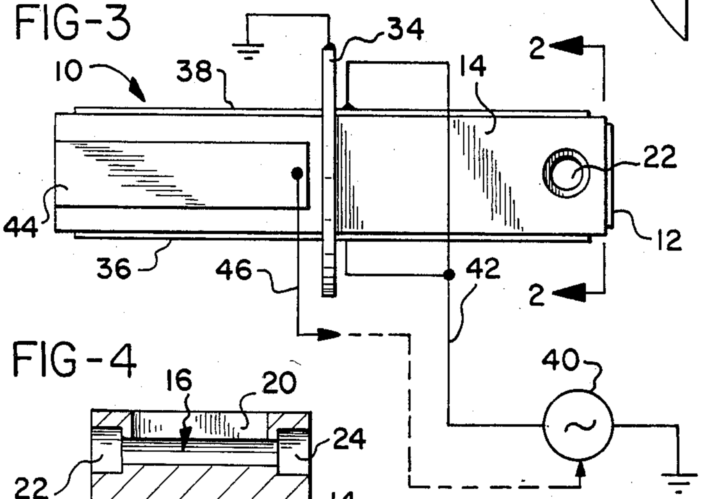
FIG-4
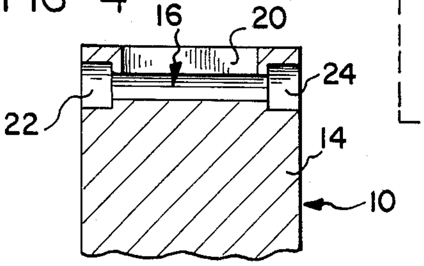

FLUID JET PRINTER AND METHOD OF ULTRASONIC CLEANING

The present invention relates to fluid jet systems and, more particularly, to an arrangement and method for cleaning dried ink and other contaminants from the orifice or orifices from which the jet drop streams eminate in a fluid jet device.

Ink jet printers, such as shown in U.S. Pat. No. 3,701,998, issued Oct. 31, 1972, to Mathis, are well known in which an electrically conductive fluid is supplied under pressure to a fluid receiving reservoir defined by a print head. The reservoir communicates with one or more orifices defined by an orifice plate, such that the fluid emerges from the orifices as fluid filaments. The fluid filaments break up into streams of drops. As the drops are formed they are selectively charged. Selected ones of the drops are then directed by an electrical field into catch trajectories in which the drops strike drop catchers, while others of the drops are directed into print trajectories in which they are deposited upon a print receiving medium.

Left to natural disturbances within a filament, a series of drops of varying size and spacing would be produced. The regularity of drop break up and uniformity of drop size are enhanced, however, by applying mechanical vibrational energy to the print head or directly to the orifice plate. This technique, termed jet stimulation, facilitates the drop charging process, since the point of drop formation is closely controlled and it is possible to position a charging electrode close to this point. Additionally, stimulation allows the deflected trajectory of each drop to be more accurately controlled since drop size is uniform, and the amount of deflection is inversely related to the mass of each drop. In traveling wave stimulation, as illustrated in the above identified Mathis patent, a series of bending waves are caused to travel along the orifice plate and are coupled sequentially to each of the orifices in one or more rows of orifices. In other stimulation techniques, the entire print head is mechanically vibrated to enhance drop break up.

Typically jet printers of this type use a solvent based ink, such as a water based ink. It is not uncommon for particles of dried ink to become lodged in or adjacent to orifices in the fluid receiving reservoir. Additionally, since the drops which are caught and not deposited upon the print receiving medium are typically recirculated to the fluid supply system for reuse, it will be appreciated that contaminants, such as paper dust, will be ingested into the fluid supply system and may not be fully removed by a fluid filtration. These particles, as well as ink particles, may settle out and attach to various portions of the fluid supply system. The particles may subsequently break loose and migrate to other portions of the fluid supply system.

Any of these processes may produce a particle which either blocks or partially hinders the flow of fluid through one or more orifices. It will be appreciated that where an orifice is totally blocked, the print positions on the print receiving medium which were to be serviced by the jet drop stream eminating from that orifice will not be printed and, therefore, a noticeable white strip along the print receiving medium will be produced. On the other hand, if an orifice is partially blocked, the initial trajectory of the drops produced by the orifice will typically be somewhat crooked. As a consequence, although drops from the jet drop stream eminating from the partially blocked orifice will be deposited on the print receiving medium, the positions at which the drops are deposited may not coincide precisely with the positions at which it is desired to deposit the drops.

When an orifice becomes clogged in many prior art ink jet printers, it is necessary to remove the print head from the printer and clean it thoroughly by any of a number of known cleaning techniques. It will be appreciated that the removal, cleaning, and reinstallation of a print head in an ink jet printer is a complex process which requires a skilled technician. As a consequence, the printer may be down for a considerable period of time before a technician is available to service it.

Several approaches have been taken to provide for cleaning an ink jet printer print head without removing the print head from the printer structure. U.S. Pat. No. 4,007,465, issued Feb. 8, 1977, to Chaudhary discloses a fluid jet print head in which the head defines a manifold which communicates with the orifices, and two fluid supply paths at different sides of the manifold. One of the supply paths is located at the top of the manifold and is reversible. If air or an impurity causing a clogging of an orifice is encountered, the top path may be reversed so the fluid enters from one path and exits at the top. This cross flushing at the orifice tends to loosen and remove the clog and purges the impurity or air from the print head. This air or impurity flows out through the reversible fluid path. Chaudhray teaches that it is preferable to terminate mechanical stimulation of the print head during the cross flushing operation due to the fact that the pressure of the fluid in the print head is reduced substantially during cross flushing.

In U.S. Pat. No. 4,276,554, issued June 30, 1981, to Terasawa, a printer is disclosed which includes a means for manually overpressurizing the ink supply chamber communicating with the nozzle structure of the ink jet printer. When the chamber is overpressurized, the increased pressure in the region of the nozzle forces any clogging material out of the nozzle and returns the operation of the printer to normal.

U.S. Pat. No. 4,296,418, issued Oct. 20, 1981, to Yamazaki et al discloses an ink jet printer in which a pressure sensor is provided in the printer nozzle, and a second sensor is mounted on the catcher. This second sensor produces a sensing signal when drops strike the catcher at a predetermined position. If the jet drop stream is fully clogged, the fluid pressure in the nozzle will increase above its normal operating level, thus actuating the pressure sensor. On the other hand, if the nozzle is only partially clogged, the initial trajectory of the jet drop stream will be in error and, consequently, the drops deflected to the catcher will strike the catcher at a point other than that intended. The sensor arrangements provide a means for detecting partial or full clogging of the nozzle. In response to such clogging, the Yamazaki et al system clears the nozzle by moving a cap into a position in which it covers the nozzle orifice. Solvent then flows through the nozzle from the cap and dissolves the clogging ink. This technique, relying on an ink solvent, may not be effective with other types of contaminants and particles.

U.S. Pat. No. 4,144,537, issued Mar. 13, 1979, to Kimura et al discloses a printer which includes apparatus for capping the nozzle of the ink jet print head. This prevents dust from adhering to the nozzle and eliminates bubbles from getting into the nozzle, thereby precluding the drying of ink. A purging arrangement consisting essentially of a suction tube purges the nozzle of the print head. This may not be effective after a clogging condition has occurred.

U.S. Pat. No. 4,340,897, issued July 20, 1982, to Miller discloses a device for cleaning a single orifice or multiple orifice print head of an ink jet printer. A brush formed of a plurality of fiber elements is used to clean the orifices. The brush defines an interior vacuum chamber, connected to a fluid reservoir which is maintained at sub-atmospheric pressure. Fluid from the print head passes along the brush fibers and is carried away by a vacuum line which connects the interior chamber of the brush with the fluid reservoir.

Accordingly, it is seen that there is a need for a simple, inexpensive, quick way to effectuate cleaning of a print head in a fluid jet printer in order to ensure that partially clogged and completely clogged orifices are cleaned without the necessity of removing the print head from the printer, and without the use of a cleaning brush or other implement which may not effectively clean all of the orifices in a multiple orifice printer.

SUMMARY OF THE INVENTION

A fluid jet system for producing at least one jet drop stream includes a print head means defining a fluid receiving reservoir. The print head means has an orifice plate which defines at least one orifice communicating with the reservoir such that fluid supplied to the reservoir under pressure emerges from the orifice as a fluid filament. A transducer means is responsive to a drive signal to apply vibrational energy to the orifice plate to stimulate break up of the filament into a stream of drops of substantially uniform size and spacing. A drive means applies a substantially sinusoidal drive signal to the transducer means, whereby the filament is stimulated to break up into drops, and applies a cleaning drive signal approximating a pulse train to the transducer means. The reservoir, the orifice plate, and the orifice are cleaned ultrasonically as a result of the harmonics of the vibrational energy applied to the orifice plate in response to the cleaning drive signal.

The drive means may produce a cleaning drive signal having pulses at substantially the same frequency as the substantially sinusoidal drive signal, but substantially greater in magnitude. The system may further include feedback means for sensing the amplitude of the vibrational energy applied to the orifice plate and for providing a feedback signal to the drive means proporational to the amplitude of the vibrational energy.

The drive means may include means for attenuating the feedback signal when the cleaning drive signal is to be applied to the transducer means, whereby the amplitude of the signal applied to the transducer means is increased. The drive means may include a power amplifier which is driven into saturation when the feedback signal is attenuated, whereby the cleaning drive signal approximates a pulse train.

The print head means includes an elongated print head body, the length of the body between the first and second ends thereof being substantially greater than its other dimensions. The body defines the fluid receiving reservoir in the first end thereof. Support means engages the print head body intermediate the first and second ends. The transducer means is mounted on the exterior of the body and extends a substantial distance along the body in the direction of elongation thereof. The transducer means changes dimension in the direction of elongation of the body, thereby causing mechanical vibration of the body and application of vibrational energy to the orifice plate.

The transducer means may comprise a pair of piezoelectric transducers, bonded to opposite sides of the body and extending in the direction of elongation. The piezoelectric transducers provide alternate lengthening and contraction of the elongated print head body in the direction of elongation thereof.

The system may further comprise cross-flush means for flushing fluid through the reservoir in a direction generally parallel to the orifice plate when the cleaning drive signal is applied to the transducer means, whereby contaminants freed from the reservoir, the orifice plate and the orifice are removed from the print head.

The drive means may comprise manual switch means for controlling application of either the substantially sinusoidal drive signal or the cleaning drive signal to the transducer means.

The orifice plate may define a plurality of orifices which communicate with the fluid receiving reservoir. The orifices are arranged in a row such that fluid from the reservoir flows through the orifices and emerges as fluid filaments. The transducer means may further comprise an electromechanical transducer, mounted to contact the orifice plate adjacent one end of the row of orifices, for causing bending waves in the orifice plate which travel along the orifice plate in a direction substantially parallel to the row of orifices.

The method of the present invention for cleaning a fluid jet system of the type having a print head defining a fluid receiving reservoir, and including an orifice plate which defines at least one orifice communicating with the reservoir and a transducer which applies vibrational energy to the orifice plate in response to a substantially sinusoidal drive signal, thereby stimulating the break up of fluid emerging from the orifice plate into a jet drop streams includes the step of:

supplying a cleaning drive signal to the transducer, the cleaning drive signal approximating a pulse train, whereby harmonic vibration of the orifice plate ultrasonically removes contaminants therefrom.

The step of supplying a cleaning drive signal may include the step of supplying a cleaning drive signal to the transducer having an amplitude substantially greater than the substantially sinusoidal drive signal. The method may further include the step of flushing the reservoir while the cleaning drive signal is being applied to the transducer.

The step of flushing the reservoir may include the step of supplying fluid to the reservoir through a fluid supply opening and simultaneously removing fluid from the reservoir through a fluid outlet opening so as to produce fluid flow through the reservoir in a direction generally parallel to the orifice plate. The step of supplying a cleaning drive signal may include the step of supplying a cleaning drive signal to the transducer means at a frequency substantially equal to the frequency of the substantially sinusoidal drive signal.

Accordingly, it is an object of the present invention to provide a fluid jet system and cleaning method in which the fluid jet print head is cleaned without tne necessity of removing the print head from the system; to provide such a system and method in which cleaning of the orifice plate orifice and reservoir is accomplisned ultrasonically; to provide such a system and method in which the ultrasonic energy is produced by the same transducer structure which causes jet drop stream break up during operation of the system; to provide such a system and method in which a cleaning drive signal approximating a pulse train is applied to the transducer so as to produce harmonic vibrations of sufficient amplitude to clean the print head; and to provide such a system and method in which the cleaning drive signal is substantially equal in frequency to the substantially sinusoidal drive signal applied to the transducer during operation of the system.

Other objects and advantages of the invention will be apparent from the following description, the accompanying drawings and the appended claims.

BRIEF DESCRIPTION OF THE DRAWINGS

FIG. 1 is an exploded view, illustrating a first type of print head and transducer means which may be used in the present invention;

FIG. 2 is a plan view of the print head and transducer means of FIG. 1, with the orifice plate removed;

FIG. 3 is a side view of the print head and transducer means of FIG. 1 with the electrical drive circuitry illustrated;

FIG. 4 is an enlarged partial sectional view, taken generally along line 4—4 in FIG. 2;

DETAILED DESCRIPTION OF THE PREFERRED EMBODIMENTS

Figure 6:
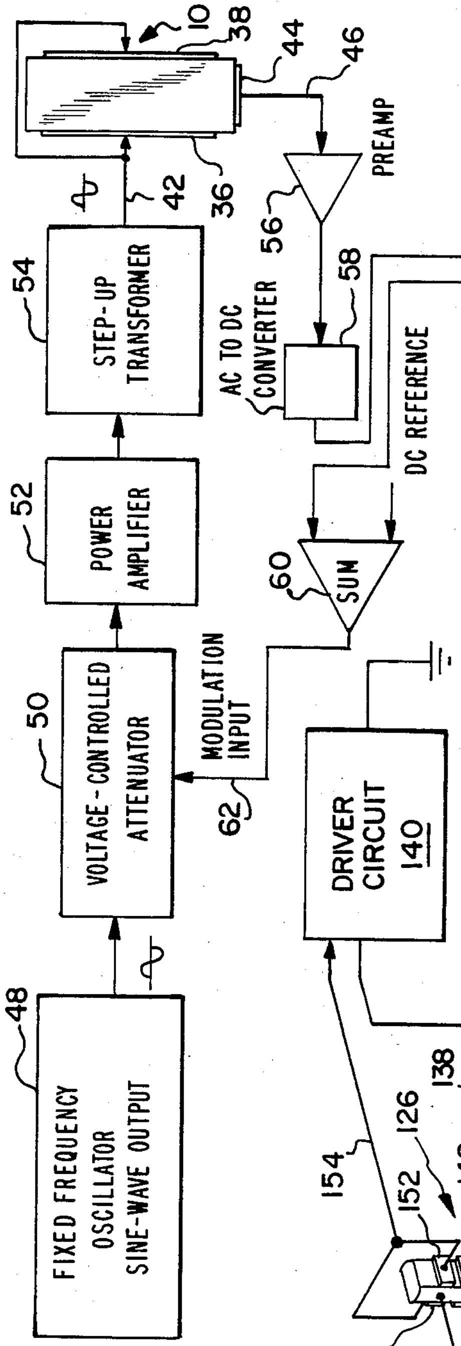
FIG. 6 is a schematic diagram illustrating driving circuitry for the fluid print head.

The present invention relates to a fluid jet system of the type which may be used for ink jet printing, coating, textile dyeing, and other purposes. As is known, such devices typically operate by electrically charging the drops in one or more jet drop streams and, thereafter, deflecting the trajectories of some of the drops by means of electrical fields.

In order to produce the stream or streams of drops, fluid is typically applied to a fluid reservoir under pressure such that it then flows through one or more orifices or nozzles which communicate with the reservoir. The fluid emerges from the orifices as fluid filaments which, if left undisturbed, would break up somewhat irregularly into drops of varying size and spacing. It is not possible to charge and deflect such non-uniform drops accurately and, as a consequence, jet drop devices have typically applied mechanical stimulation in some fashion to the fluid filaments so as to cause break up of the filaments into drops of generally uniform size and spacing at a desired drop break up frequency.

A first type of print head and transducer means which may be used in the present invention is shown in FIGS. 1–4. The print head generally includes an elongated print head body 10, the length of which, L, is substantially greater than its other dimensions a and b. The body 10 includes an orifice plate 12 and a block of material 14. The body 10 defines a fluid receiving reservoir 16 in its first end, and at least one and preferably a number of orifices 18 which are arranged in a row across orifice plate 12. The orifice plate 12 is bonded to block 14 of material, such as stainless steel by means of a suitable adhesive. Block 14 defines a slot 20 which, in conjunction with orifice plate 12 defines the reservoir 16. The block 14 further defines a fluid supply opening 22 and a fluid outlet opening 24, both of which communicate with the slot 20.

The fluid jet system further includes means for supplying fluid to the reservoir 16 under pressure such that fluid emerges from the orifices 18 as fluid filaments which then break up into streams of drops. This includes a pump 26 which receives fluid from a tank 28 and delivers it, via fluid conduit line 30, to the reservoir 16. A conduit 32 is connected to fluid outlet 24 such that fluid may be removed from the reservoir 16 at shut down of the print head or during cross-flushing of the reservoir 16, as described more fully below. The end of the print head to which conduits 30 and 32 are attached, including orifice plate 12, is subjected to mechanical vibrational energy which causes the fluid filaments to break up into streams of drops of uniform size and spacing. The conduits 30 and 32 are selected from among a number of materials, such as a polymeric material, which have a vibrational impedance substantially different from that of the stainless steel block 14. As a consequence, power loss through the conduits 30 and 32, and the resulting damping of the vibrations are minimized.

The system further includes mounting flanges 34 which are relatively thin and are integrally formed with the block 14. The flanges 34 extend from opposite sides of the elongated print head body 10 and are substantially equidistant from the first and second ends of the body. As a result, the flanges may be used to support the body 10 in a nodal plane and are therefore not subjected to substantial stress.

The system further comprises a transducer means, including thin piezoelectric transducers 36 and 38. The transducers are bonded to the exterior of the body of block 14 and extend a substantial distance along the body in the direction of elongation thereof, from adjacent the support means toward both the first and second ends of the body. The transducers 36 and 38 respond to a substantially electrical drive signal, provided by power supply 40 on line 42, by changing dimension, thereby causing mechanical vibration of the body and break up of the fluid streams into streams of drops.

The piezoelectric transducers 36 and 38 have electrically conductive coatings on their outer surfaces, that is the surfaces away from the print head block 14, which define a first electrode for each such transducer. The metallic print head block 14 typically grounded, provides the second electrode for each of the transducers. The piezoelectric transducers are selected such that when driven by an a.c. drive signal, they alternately expand and contract in the direction of elongation of the print head. As may be seen in FIG. 3, transducers 36 and 38 are electrically connected in parallel. The transducers are oriented such that a driving signal on line 42 causes them to elongate and contract in unison. Since the transducers 36 and 38 are bonded to the block 14, they cause the block to elongate and contract, as well.

If desired, an additional piezoelectric transducer 44 may be bonded to one of the narrower sides of the print head to act as a feedback means and to provide an electrical feedback signal on line 46 which fluctuates in correspondence with the elongation and contraction of the print head block 14. The amplitude of the signal on line 46 is proportional to the amplitude of the mechanical vibration of the block 14.

The steel block 14 which forms a part of the print head body can be considered to be a very stiff spring. If properly mechanically stimulated, it may therefore be held at its center, as by flanges 34, while both ends of the block 14 alternately move toward and away from the center. Since the center of the block lies in a nodal plane, the flanges 34 are not subjected to substantial vibration and the support for the print head does not interfere with its operation. As the end of the print head body 10 which defines the fluid receiving reservoir 16 is vibrated, the vibrations are transmitted to the fluid filaments which emerge from the orifices 16, thus causing substantially simultaneous uniform drop break up. Note that the reservoir 16 is small in relation to the overall size of the block 14 and is centered in the end of the block. As a consequence, the reservoir 16 does not interfere significantly with the vibration of the block 14, nor affect the resonant frequency of the print head substantially.

By providing a pair of piezoelectric transducers 36 and 38 on opposite sides of the block 14, the block 14 is elongated and contracted without the flexure oscillations which would otherwise result if only one such piezoelectric transducer were utilized. Additionally, the use of two piezoelectric transducers allows for a higher power input into the print head for a given voltage and, consequently, for a higher maximum power input into the print head, since only a limited voltage differential may be placed across a piezoelectric transducer without break down of the transducer.

FIG. 6 illustrates a drive means which applies a substantially sinusoidal drive signal to the transducer means and which may also be used to apply a cleaning drive signal, approximating a pulse train, to the transducer means. The output of a fixed frequency oscillator 48, operating at approximately 50 KHz, is supplied to transducers 36 and 38 via a voltage controlled attenuator circuit 50, a power amplifier 52 and a step-up transformer 54. The output from transducer 44 on line 46 is used to control the amount of attenuation provided by circuit 50. The signal on line 46 is amplified by amplifier 56, converted to a d.c. signal by converter 58, and then supplied to circuit 59 which, during normal operation, passes it directly to summing circuit 60. This signal is compared to a selected reference signal by summing circuit 60 to produce a signal on line 62 which controls the attenuation provided by circuit 50. By this feedback arrangement, the amplitude of the drive signal on line 42 and the amplitude of the mechanical vibration of the print head are precisely controlled. Typically, a substantially sinusoidal drive signal of approximately 3 volts rms is applied to the transducers.

When it is necessary to clean the reservoir 16, the orifice plate 12 or the orifices 18, switch 62 is actuated manually into its lower switching position in which circuit 59 attenuates the output from converter 58 by means of voltage divider formed from resistors 64 and 66. As a result of this attenuation, the summing circuit 60 supplies a control signal to attenuator 50 which causes attenuator 50 to permit a much larger amplitude signal to be applied to power amplifier 52. Amplifier 52 is driven into saturation at the extreme levels of its input, thus resulting in a square wave signal approximating a pulse train being applied to transducers 36 and 38. The square wave is of a substantially greater amplitude than the sinusoidal drive signal. Typically the cleaning drive signal fluctuates between plus and minus 9 volts.

It will be appreciated that a square wave signal consists of a number of harmonic signals of higher frequencies. This cleaning drive signal therefore has at least some components which are higher in frequency than the substantially sinusoidal drive signal. The cleaning drive signal produces ultrasonic vibrations in the print head and associated structures which tend to dislodge dried fluid and contaminant particles from their points of attachment in the fluid supply system. By rapidly cross flushing fluid through reservoir 16 via lines 30 and 32, such particles can be removed from the print head and normal operation may then be resumed. If desired, fluid in the reservoir may be held at or below ambient pressure to insure that fluid flow through the orifices is prevented.

Figure 5:
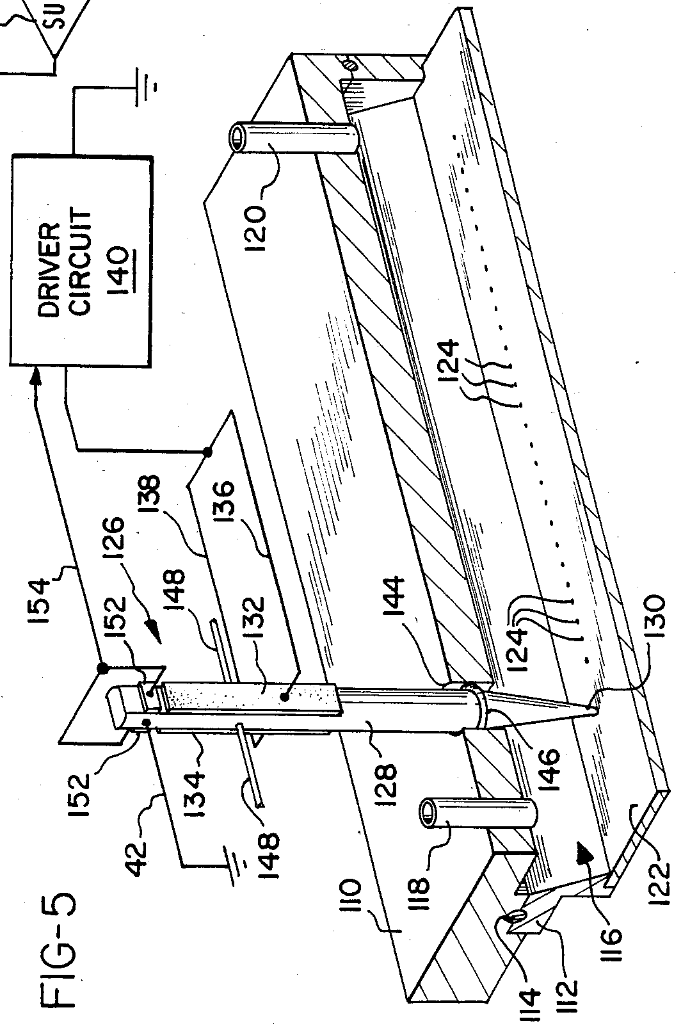
FIG. 5 is a perspective view of a second type of print head and transducer means which may be used in the present invention, with portions broken away to reveal interior structure.

It will be appreciated that the present invention may also be utilized in conjunction with a second type of print head and transducer means, as shown in FIG. 5, which operate through traveling wave stimulation in which bending waves travel along orifice plate 122. The print head includes a manifold means consisting of an upper manifold element 110, a lower manifold element 112, and a gasket 114 therebetween. The manifold means defines a fluid receiving reservoir 116 to which fluid may be applied under pressure via fluid inlet tube 118. Fluid may be removed from reservoir 116 through outlet tube 120 during cleaning operations or prior to extended periods of print head shutdown.

An orifice plate 122 is mounted on the manifold means. The plate is formed of a metal material and is relatively thin so as to be somewhat flexible. Orifice plate 122 is bonded to the manifold element 112, as for example by solder or by an adhesive, such that it closes and defines one wall of the reservoir 116. Orifice plate 122 defines a plurality of orifices 124 which are arranged in at least one row and which communicate with the reservoir 116 such that fluid in the reservoir 116 flows through the orifices 124 and emerges therefrom as fluid filaments.

A stimulator means 126 mounted in contact with the orifice plate 122 vibrates the orifice plate to produce a series of bending waves which travel along the orifice plate 122 in a direction generally parallel to the row of orifices. The stimulator means 126 includes a stimulator member 128, configured as a thin metal rod. The type of metal for the stimulator member 128 is selected to be compatible with the fluid supplied to reservoir 116. The stimulator member 128 is of a length L which is substantially equal to $n\lambda/2$, where n is a positive integer and $\lambda$ is the wavelength of an acoustic wave traveling along the stimulator member 128. As is known, the wavelength of such a wave, traveling along a thin rod, is substantially equal to $(Y/\rho)^{\frac{1}{2}}/f$, where Y is Young's modulus, $\rho$ is the density of the stimulator member material, and f is the frequency of acoustic waves generated in the member.

The end 130 of member 128 is tapered so that the member 128 contacts the orifice plate 122 substantially at a point. As is known, such point contact on the center line of the orifice plate 122 insures that bending waves of a first order are generated in the orifice plate 122, and that satisfactory stimulation is obtained.

The stimulator means 126 further includes piezoelectric crystal means, comprising piezoelectric crystals 132 and 134, which are mounted on the stimulator member 128. The crystals 32 and 34 each include a thin, electrically conductive layer on their outer surfaces to which conductors 136 and 138 are electrically connected. The inner surfaces of the crystals are in contact with and are grounded by the member 128. Member 128, in turn, may be grounded through orifice plate 122 or through ground conductor 142. The crystals 132 and 134 are configured such that they tend to compress or extend in a direction parallel to the axis of elongation of the member 128 when a fluctuating electrical potential is placed across the crystals. As a consequence, when an a.c. electrical drive signal is applied to lines 136 and 138 by driver circuit means 140, the crystals 132 and 134 produce acoustic waves in the stimulator member 128. During normal operation, circuit 140 supplies a substantially sinusoidal drive signal at a frequency f, as specified above in relation to the length of the member 128.

The stimulator member is substantially equal in length to one wavelength, that is, n is equal to 2. The member 128 extends into the manifold means through an opening 144 defined by element 110. The member 128 contacts the orifice plate 122 inside the reservoir 116. A seal, such as O-ring 146, surrounds the member 128, contacting the member 128 and element 110.

The stimulator means is mounted by tapered pins 148 which engage generally conical detents in the sides of member 128. The pins 148 and detends provide a pivotal mounting which restricts movement of member 128 vertically. The detents are positioned $\frac{1}{4}\lambda$ from the upper end of the member 128, while the O-ring 146 contacts the member 128 substantially $\frac{1}{4}\lambda$ from the lower end of the member 128. It will be appreciated that since crystals 132 and 134 extend above and below the detents by substantially equal distances, pins 148 support the stimulator means in a nodal plane. Since the ring 146 contacts the member 128 $\frac{1}{2}\lambda$ below the pins 148, O-ring 146 also contacts the member 128 at a nodal plane. Thus substantial damping between the member 128 and the ring 146 does not occur. Additionally, the end of 130 of the member 128 is $\frac{1}{4}\lambda$ below a nodal plane and therefore at an anti-node, producing maximum amplitude mechanical stimulation for generation of the bending waves in the orifice plate 122.

An additional pair of piezoelectric crystals 152 may also be mounted on the member 128. Crystals 152 act as a feedback means and provide an electrical feedback signal on line 154 which is proportional in frequency and amplitude to the frequency and amplitude of the acoustic waves traveling through the member 128. The feedback signal on line 154 may be used by the drive circuit 140 to control the amplitude of the substantially sinusoidal drive signal applied on lines 136 and 138.

The circuit 140 is identical to that shown in FIG. 6. When it becomes necessary to clean the print head, circuit 140 applies a cleaning signal to transducers 132 and 134 which approximates a pulse train. As a consequence, the higher order harmonics of this non-sinusoidal driving signal cause high frequency vibrational energy to be applied to the orifice plate 122, disloding contaminant particles. Simultaneously the reservoir 116 is cross flushed by a substantial fluid flow through lines 118 and 120. After the cleaning operation is completed, circuit 140 once again applies a substantially sinusoidal drive signal to lines 136 and 138 and normal operation is resumed.

If the pressure of the fluid in either type of print head is maintained at approximately that used during printing, it will be appreciated that fluid will continue to flow through the orifices. The nonsinusoidal drive signal applied to the transducer arrangement will produce drop break up, unpredictable drop trajectories, satellite drops and spatter. If the print head is being used in conjunction with charging electrodes, the electrodes are preferably moved from their operating positions during the cleaning operation in order to avoid contamination. Alternatively, if an undesirable residue is not left on the electrodes by dried fluid, the electrodes may be left in their operating positions during print head cleaning and subsequently air dried.

It will be appreciated that the present invention is not limited to the precise method and form of apparatus disclosed, but that changes may be made in either without departing from the scope of the invention.

What is claimed is:

1. A fluid jet system for producing a plurality of jet drop streams, comprising:

print head means defining a fluid receiving reservoir and including an orifice plate defining a plurality of orifices which communicate with said reservoir such that fluid supplied to said reservoir under pressure emerges from said orifices as a plurality of fluid filaments, transducer means, responsive to a drive signal, for applying vibrational energy to said orifice plate to stimulate breakup of said filaments into streams of drops of substantially uniform size and spacing, sinusoidal drive means for applying a substantially sinusoidal drive signal to said transducer means so that said filaments are stimulated to break up into drops, and cleaning drive means for causing replacement of said sinusoidal drive signal by a pulse train at substantially the same frequency as said substantially sinusoidal drive signal and at an amplitude such that cleaning of said print head is produced by harmonic frequencies of said pulse train.

2. A fluid jet system according to claim 1 wherein said sinusoidal drive means comprises means for generating a relatively low amplitude sine wave signal and an amplifier for amplifying said signal to create said substantially sinusoidal drive signal and said cleaning drive means comprises means for driving said amplifier into saturation whereby said sinusoidal drive signal is transformed into said pulse train.

3. The system of claim 1 in which said drive means produces said cleaning drive signal including pulses at substantially the same frequency as said substantially sinusoidal drive signal, but substantially greater in magnitude.

4. The system of claim 1 further including feedback means for sensing the amplitude of the vibrational energy applied to said orifice plate and for providing a feedback signal to said drive means proportional to the amplitude of the vibrational energy.

5. The system of claim 4 in which said drive means includes means for attenuating said feedback signal when said cleaning drive signal is to be applied to said transducer means, whereby the amplitude of the signal applied to said transducer means is increased.

6. The system of claim 5 in which said drive means includes a power amplifier which is driven into saturation when said feedback signal is attenuated, whereby said cleaning drive signal approximates a pulse train.

7. The system of claim 1 in which said print head means includes an elongated print head body, the length of said body between first and second ends thereof being substantially greater than its other dimensions, said body defining said fluid receiving reservoir in said first end thereof, and support means for engaging said print head body intermediate said first and second ends, and in which said transducer means is mounted on the exterior of said body and extends a substantial distance along said body in the direction of elongation thereof, said transducer means changing dimension in the direction of elongation of said body, thereby causing mechanical vibration of said body and application of vibrational energy to said orifice plate.

8. The system of claim 7 in which said transducer means comprises a pair of piezoelectric transducers, bonded to opposite sides of said body and extending in the direction of elongation, said piezoelectric transducers providing alternate lengthening and contraction of said elongated print head body in the direction of elongation thereof.

9. The system of claim 1, further comprising cross flush means for flushing fluid through said reservoir in a direction generally parallel to said orifice plate when said cleaning drive signal is applied to said transducer means, whereby contaminants freed from said reservoir, said orifice plate and said orifice are removed from said print head.

10. The system of claim 1 in which said drive means comprises manual switch means for controlling application of either said substantially sinusoidal drive signal or said cleaning drive signal to said transducer means.

11. The system of claim 1 in which said orifice plate defines a plurality of orifices which communicate with said fluid receiving reservoir, said orifices being arranged in a row such that fluid from said reservoir flows through said orifices and emerges as fluid filaments.

12. The system of claim 11 in which said transducer means comprises an electromechanical transducer, mounted to contact said orifice plate adjacent one end of said row of orifices, for causing bending waves in said orifice plate which travel along said orifice plate in a direction substantially parallel to said row of orifices.

13. A method of cleaning a fluid jet system of the type having a print head defining a fluid receiving reservoir and including an orifice plate which defines a plurality of orifices communicating with said reservoir, and a transducer means which applies vibrational energy to the orifice plate in response to a substantially sinusoidal drive signal, thereby stimulating the breakup of fluid emerging from said orifice into a drop stream, comprising the step of:

supplying to said transducer means a cleaning drive signal comprising a pulse train including pulses at substantially the same frequency as said substantially sinusoidal drive signal and at an amplitude such that harmonic frequencies of said pulse drive signal ultrasonically remove contaminants from said print head.

14. The method of cleaning a fluid jet system of claim 2 in which the step of supplying a cleaning drive signal includes the step of supplying a cleaning drive signal to said transducer means having an amplitude substantially greater than said substantially sinusoidal drive signal.

15. The method of cleaning a fluid jet system of claim 13 further comprising the step of flushing said reservoir while said cleaning drive signal is being applied to said transducer means.

16. The method of cleaning a fluid jet system of claim 15 in which the step of flushing said reservoir includes the step of supplying fluid to said reservoir through a fluid supply opening and simultaneously removing fluid from said reservoir through a fluid outlet opening so as to produce fluid flow through said reservoir in a direction generally parallel to said orifice plate.

17. The method of cleaning a fluid jet system of claim 13 in which said step of supplying a cleaning drive signal includes the step of supplying a cleaning drive signal to said transducer means at a frequency substantially equal to the frequency of said substantially sinusoidal drive signal.

* * * * *